United States Patent [19]
Endo et al.

[11] Patent Number: 5,235,292
[45] Date of Patent: Aug. 10, 1993

[54] SIGNAL GENERATOR HAVING BACKUP OSCILLATOR SWITCHING CIRCUIT

[75] Inventors: Yoichi Endo; Eiji Itaya; Yoshiaki Kumagai, all of Kawasaki, Japan

[73] Assignee: Fujitsu Limited, Kawasaki, Japan

[21] Appl. No.: 892,923

[22] Filed: Jun. 3, 1992

[30] Foreign Application Priority Data

Jun. 4, 1991 [JP] Japan ................... 3-132867

[51] Int. Cl.$^5$ .......... H03B 1/00; H03K 3/00; H03L 7/06
[52] U.S. Cl. .................... 331/49; 307/219; 328/61; 328/104; 331/18
[58] Field of Search ............. 331/49, 56, 18; 307/64, 307/65, 219; 328/61, 103, 104; 371/8.1, 61; 375/108; 364/934.51, 934

[56] References Cited

U.S. PATENT DOCUMENTS 3,803,568  4/1974  Higashide ................. 340/213 R
4,949,052  8/1990  Chigira ........................ 331/49

*Primary Examiner*—Siegfried H. Grimm
*Attorney, Agent, or Firm*—Staas & Halsey

[57] ABSTRACT

A signal generator having a switching function includes a first oscillation circuit, a second oscillation circuit, a frequency-division circuit and a combination circuit. The first oscillation circuit outputs a first frequency signal having a first frequency and a reset signal synchronized with the first frequency signal. The second oscillation circuit outputs a second frequency signal having a second frequency which is N times higher than the first frequency. The frequency-division circuit frequency-divides the second frequency signal by N, resets a value for frequency-division based on the reset signal and generates a divided second frequency signal. The combination circuit combines the first frequency signal and the divided second frequency signal and outputs a combined signal.

19 Claims, 9 Drawing Sheets

FIG.11
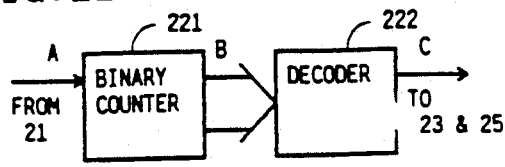
FIG.12A
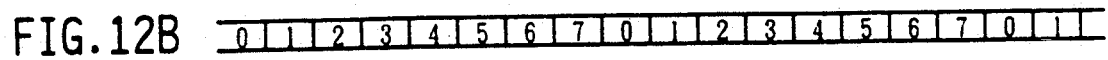
FIG.12B
FIG.12C
FIG.13
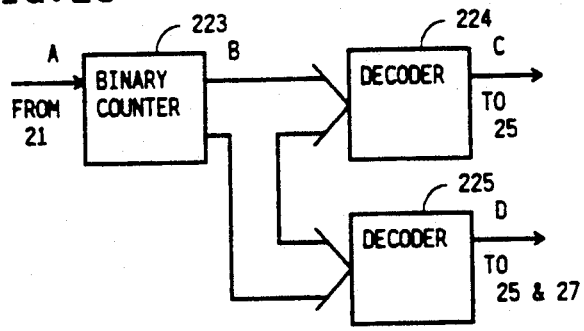
FIG.14A
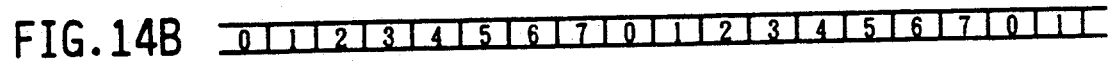
FIG.14B
FIG.14C
FIG.14D 0 1 0 1 2 3 4 5 0 1 2 3 4 5 6 7 0 1

SIGNAL GENERATOR HAVING BACKUP OSCILLATOR SWITCHING CIRCUIT

BACKGROUND OF THE INVENTION

1. Field of the Invention

The present invention relates to a signal generator having a switching function for disconnecting an oscillator of a working system, when a failure occurs therein, and connecting an oscillator of a backup system.

2. Description of the Related Art

With recent advances in sophisticated information transmission, for example transmission of banking data, apparatus to be used for communication lines are required to have very high reliability.

Therefore, a method of improving reliability by providing a fully redundant structure and then switching into operation, as required, the redundant circuits has been provided for oscillators such as a local oscillator of a frequency converter in a radio communication device. However, if the switching time of the oscillator becomes longer, the oscillation signal disappears during the switching period and the frequency of a phase-locked loop circuit provided in the successive stage changes. Therefore, switching must be done within a very short period of time.

In a prior signal generator having a switching function, a watch-dog timer is provided as a failure detecting means of an oscillator and a switching instruction is issued to a switch upon judgement of a failure because no oscillation signal is input within a predetermined constant period.

An example of such a structure is shown in FIG. 1 and a timing chart indicating operations of each point A to F in FIG. 1 is shown in FIGS. 2A to 2F. In FIG. 1, the numerals 11 and 12 respectively denote crystal oscillators of the working system and backup system. A switch 14 selects any one output signal of these oscillators and inputs such output signal to a phase-locked loop (PLL) circuit 15. The PLL circuit 15 is provided for absorbing signal discontinuity during a switching operation by the switch 14. The numeral 13 denotes a control circuit such as a watch-dog timer for instructing switch 14 to perform the switching operation by detecting an OFF state of the oscillation signal A. The control circuit 13 is usually formed by a retriggerable one-shot multivibrator. Moreover, as the watching time for the detection of the OFF state, an R-C time constant is generally used.

However, in the prior art, a problem exists in that the switching operation is delayed for a period corresponding to the watching time. The watching time is required to have a duration based on the stability of the oscillation frequency and an error of the time constant (usually, 5 to 20% in the R-C circuit). Moreover the watching time is usually set to a period of 10 cycles or more in order to prevent switching from occurring frequently during the transitional period from the normal operating condition until perfect stoppage of oscillation. If switching from the oscillator 12 to the oscillator 11 is generated before the PLL circuit 15 is completely locked to a phase of the oscillator 12 after switching from the oscillator 11 to the oscillator 12, a phase error in the PLL circuit 15 is increased and the PLL circuit 15 may become out-of-synchronization.

Therefore, as shown in FIG. 2C, at least the time which is equal to several cycles of the oscillation signal may be necessary for the control circuit 13 to judge an OFF state of the oscillation signal A as a failure from the timing where the oscillation signal in the working system actually enters the OFF state (point X in FIG. 2A). Thereafter, the switch 14 switches the oscillator of the working system to that of the backup system as shown in FIG. 2D.

During the period T, which is from the timing of entering the OFF state to the timing of switching, an output frequency of PLL 15 changes by a large amount ($\Delta f$) as indicated in FIG. 2F because the switch 14 does not select the backup system even when the oscillation signal A is in the OFF state and the oscillation signal is not input to PLL 15 as shown in FIG. 2E.

SUMMARY OF THE INVENTION

It is therefore an object of the present invention to provide a signal generator having a switching function which realizes immediate switching of the working system to the backup system in response to the OFF state of the oscillation signal.

Another object of the present invention is to decrease fluctuation of the output frequency when switching occurs.

Additional objects and advantages of the invention will be set forth in part in the description which follows, and, in part, will be clear from the description, or may be learned by practice of the invention.

To achieve the foregoing objects and in accordance with the purpose of the invention, as embodied and broadly described herein, a signal generator having a switching function comprises first oscillation means, second oscillation means, frequency-division means and combination means. The first oscillation means outputs a first frequency signal having a first frequency and a reset signal synchronized with the first frequency signal. The second oscillation means outputs a second frequency signal having a second frequency which is N times the first frequency. The frequency-division means frequency-divides the second frequency signal by N, resets a value for frequency-division based on the reset signal and generates a divided second frequency signal. The combination means combines the first frequency signal and the divided second frequency signal and outputs a combined signal.

In the present invention, the frequency-division means is reset by the reset signal synchronized with the first frequency signal. Therefore, stoppage of the first frequency signal causes immediate outputting of the divided second frequency signal. And the divided second frequency signal has almost the same phase as the first frequency signal because the frequency-division means has been reset in synchronization with the first frequency signal.

BRIEF DESCRIPTION OF THE DRAWINGS

FIG. 11 is a block diagram of the frequency-divider 22 of FIG. 3;

FIGS. 12A-12C are time charts for the operation of the frequency divider of FIG. 11;

FIG. 13 is a block diagram of an alternate embodiment of a part corresponding to the frequency-divider 22 and the delay circuit 23 in FIG. 3;

FIGS. 14A-14D are time charts for the operation of the circuit of FIG. 13;

DETAILED DESCRIPTION OF THE PREFERRED EMBODIMENTS

Figure 1:
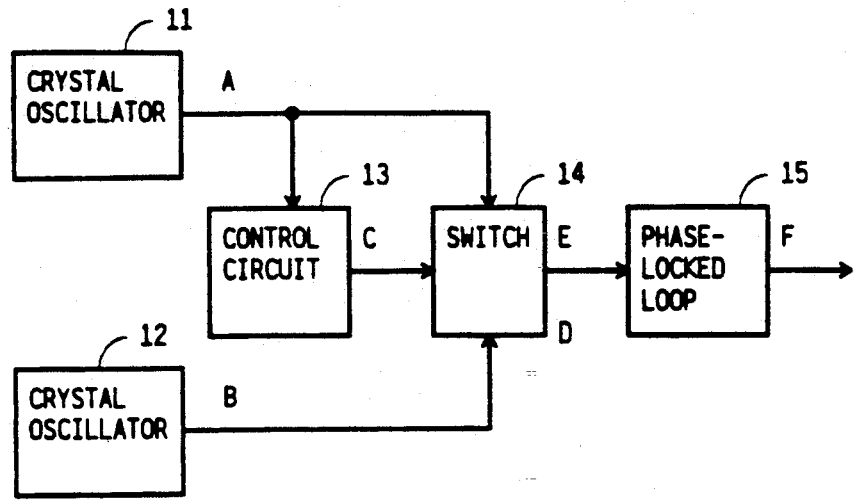
FIG. 1 is a block diagram of a prior art signal generator.
Figure 2A:
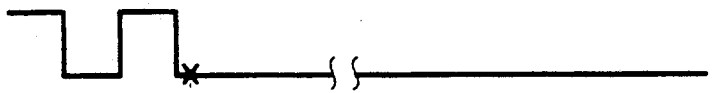
FIGS. 2A–2F are time charts for the operation of the signal generator of FIG. 1.
Figure 2B:
Figure 2C:
Figure 2D:
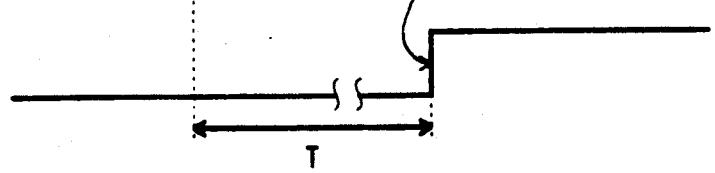
Figure 2E:
Figure 2F:
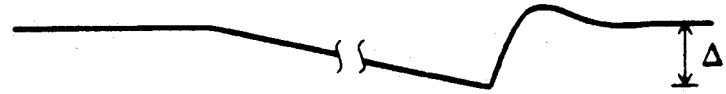
Figure 3:
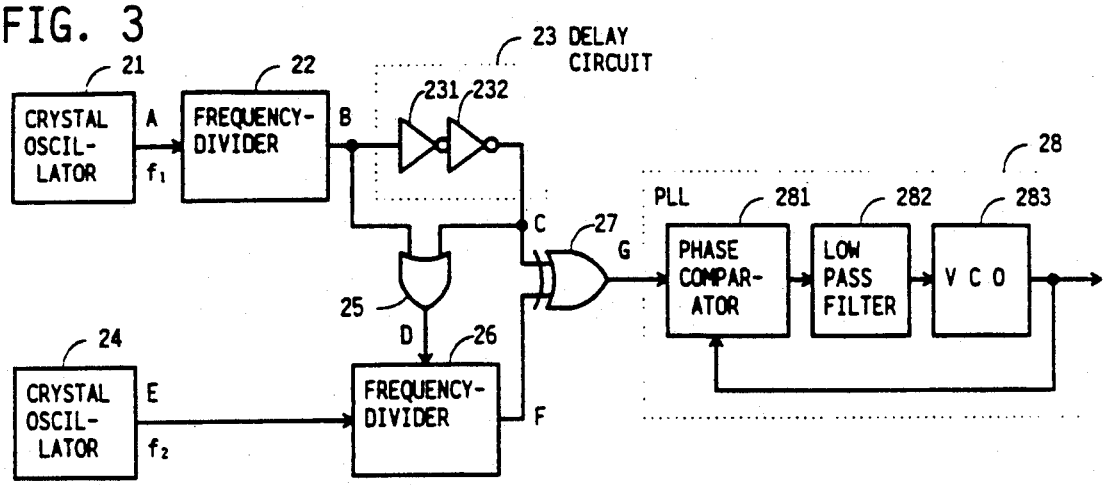
FIG. 3 is a block diagram of an embodiment of a signal generator in accordance with the present invention.

FIG. 3 is a block diagram of an embodiment of the present invention. FIG. 4A to FIG. 4G are timing charts for explaining the operation of the circuit of FIG. 3. The waveforms of the signals at the points A to G in FIG. 3 are respectively shown as FIG. 4A to FIG. 4G.

The signal generator of FIG. 3 includes working and backup oscillators 21 and 24, which are formed, for example, using a crystal-controlled oscillator, and frequency-dividers 22 and 26. A delay circuit 23 is formed by cascade-connected inverters 231 and 232, and has a delay time which may be adjusted depending on the number of inverters. An OR gate 25 is connected to the input and output of the delay circuit 23, while an exclusive-OR gate 27 operates as a switch.

As shown in FIGS. 4A-4G, a frequency divider 26 does not output a frequency-divided signal while the crystal oscillator 21 of the working system operates normally. If the frequency of the crystal oscillator 21 of the working system is defined as f1 and the frequency of the crystal oscillator 24 of the backup system is defined as f2, when f1 > f2 the frequency-divider 26 (which is reset as the point X of FIG. 4F) tries to output the frequency-divided signal at the point U. However, since it is reset by an output signal of the OR gate 25, namely by an output signal of the delay circuit 23 (FIG. 4C) at the point Z preceding the point U, the frequency-divider 26 does not output the frequency-divided signal.

Figure 4A:
FIGS. 4A–4G, 5A–5G and 6A–6G are time charts for the operation of the signal generator of FIG. 3.
Figure 4B:
Figure 4C:
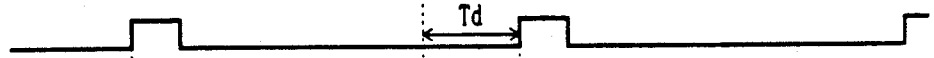
Figure 4D:
Figure 4E:
Figure 4F:
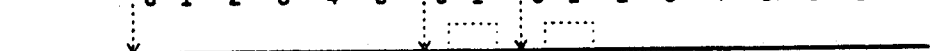
Figure 4G:
Figure 5A:
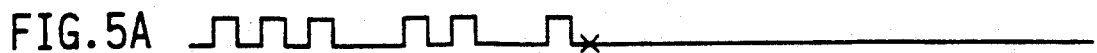
Figure 5B:
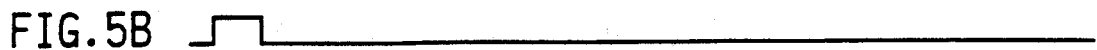
Figure 5C:
Figure 5D:
Figure 5E:
Figure 5F:
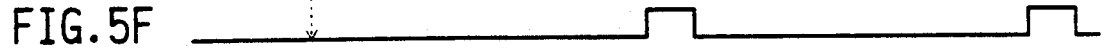
Figure 5G:
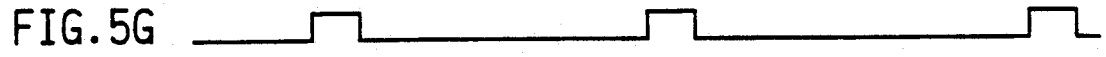
Figure 6A:
Figure 6B:
Figure 6C:
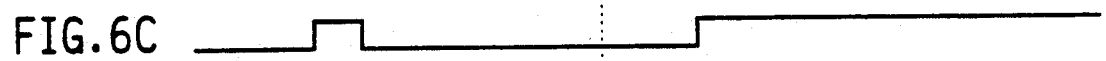
Figure 6D:
Figure 6E:
Figure 6F:
Figure 6G:

When f1 > f2, the frequency-divider 26 which is reset at the point X of FIG. 4F tries to output the frequency-divided signal at the point Y preceding the point Z. However, the frequency-divider 26 is reset with an output of the OR gate 25 at the point W. Namely, an input signal (FIG. 4B) of the delay circuit 23 is generated a time Td before the point Z and therefore the frequency-divider 26 cannot output the frequency-divided signal.

Accordingly, in FIG. 3, since an output of the frequency divider 26 is kept at the low level while the crystal oscillator 21 of the working system operates normally, an output of the crystal oscillator 21 is provided as the output of exclusive-OR gate 27 and is then supplied to PLL 28.

PLL 28 includes an edge-detection type phase comparator 281, a low pass filter 282, and a voltage-controlled oscillator (VCO) 283. The phase comparator 281 compares a front edge (rising point), namely a phase, of the output signal from the exclusive-OR gate 27 and a front edge of an output signal of the VCO 283. An output of the phase comparator 281 is input to the VCO 283 through filter 282. The VCO 283 outputs a local oscillation signal, the frequency of which is controlled by the output signal from the filter 282.

FIGS. 5A-5G and FIGS. 6A-6G are timing charts for explaining the operation of the signal generator when an output of the crystal oscillator 21 stops. FIGS. 5A-5G show waveforms for explaining the operation for the OFF state of the oscillation signal in the working system when an output (FIG. 5B) of the frequency divider 22 is at the low level. Since the frequency divider 26 has been reset continuously with an output (FIG. 5C) of the delay circuit 23 through OR gate 25 (FIG. 5D), its internal condition maintains the same relationship of phase as an output of the delay circuit 23. When the reset signal (FIG. 5D) disappears, the frequency divider 26 immediately outputs a frequency-divided signal (FIG. 5F) in substantially the same phase relationship and continuously provides a continuous reference signal to PLL 28 without allowing large fluctuation of an output (FIG. 5G) of the exclusive-OR gate 27.

FIGS. 6A-6G show waveforms for explaining the operation for the OFF state of the reference signal in the working system when an output (FIG. 6B) of the frequency-divider 22 is at the high level. In this case, an output signal of the frequency-divider 22 is inverted. Therefore, a small phase deviation is generated, but since a continuous reference signal is supplied to PLL 28 as in the case of FIG. 5G, the frequency of an output signal of PLL 28 has little change.

In the first embodiment of FIG. 3, the delay time Td of delay circuit 23 is determined by following formula:

$$Td > N/f1\ min - (N-1)/f2\ max$$

wherein f1min is the minimum frequency of the frequency fluctuation range of the oscillation signal from the crystal oscillator 21, f2max is the maximum frequency of the frequency fluctuation range of the oscillation signal from the crystal oscillator 24 and N is the dividing rate of the frequency-divider 22 and 26.

When the dividing rate N is 8, the oscillation frequency of the crystal oscillators 21 and 24 is 8 MHz and the frequency fluctuation is 50 ppm, $$Td > 8/(8,000,000 \text{ Hz} - 400 \text{ Hz}) - 7/(8,000,000 \text{ Hz} + 400 \text{ Hz}) \approx 125.1 \text{ nsec}.$$

The delay time of each inverter is 115 nsec when C-MOS 4000 series logic gates are used as inverters 231 and 232. Then Td is 230 nsec.

Figure 7:
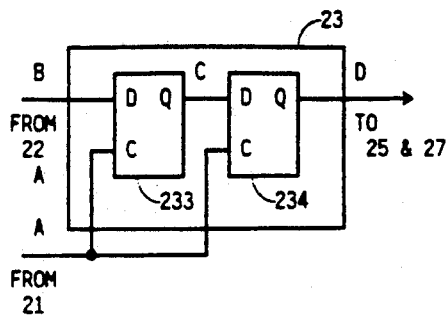
FIG. 7 is a block diagram of an alternate embodiment of the delay circuit 23 of FIG. 3.
Figure 8A:
FIGS. 8A-8D are time charts for the operation of the delay circuit of FIG. 7.
Figure 8B:
Figure 8C:
Figure 8D:

FIG. 7 shows another type of the delay circuit 23 and FIGS. 8A-8D show time charts of points A-D of FIG. 7. In FIG. 7, the delay circuit 23 includes flip-flops 233 and 234 which are connected in series. The oscillation signal from crystal oscillator 21 is used as a clock signal for the flip-flops 233 and 234. In this case, the delay time Td of the delay circuit 23 is equal to two periods of the oscillation signal from the oscillator 21.

Figure 9:
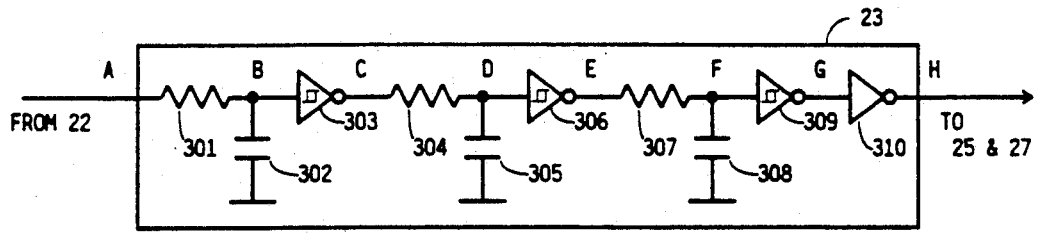
FIG. 9 is a block diagram of another alternate embodiment of the delay circuit 23 of FIG. 3.
Figure 10A:
FIGS. 10A-10H are time charts for the operation of the delay circuit of FIG. 9.
Figure 10B:
Figure 10C:
Figure 10D:
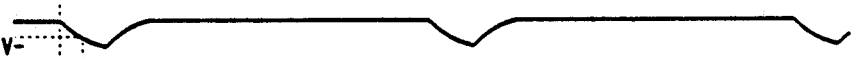
Figure 10E:
Figure 10F:
Figure 10G:
Figure 10H:

FIG. 9 shows further another type of delay circuit 23 and FIGS. 10A-10H show time charts of points A-H of FIG. 9. In FIG. 9, the delay circuit 23 includes serial resistors 301, 304 and 307, parallel capacitors 302, 305 and 308, Schmitt trigger gates 303, 306 and 309, and an inverter 310. One serial resistor, one parallel capacitor and one Schmitt trigger gate construct a unit delay circuit. When each resistor R is 1 kΩ, each capacitor C is 54.3 pF, the power supply voltage E is 5 V, the threshold voltage V+ from low level to high level of each Schmitt trigger gate is 3.15 V and the threshold voltage V− from high level to low level of each Schmitt trigger gate is 0.9 V, the rising delay time T+ and falling delay time T− of each unit delay circuit are given by the following formulas:

$$T+ = -RC \ln(1 - V+/E) = 63.6 \text{ nsec},$$

$$T- = -RC \ln(V-/E) = 109.0 \text{ nsec}.$$

Then, the total delay time Td of the delay circuit 23 in FIG. 7 is given by the following formula:

$$Td = T+ + T- + T+ = 236.2 \text{ nsec}.$$

The frequency-divider 22 is constructed by a binary counter 221 and a decoder 222 as shown as FIG. 11. FIGS. 12A-12C show time charts of points A-C in FIG. 11. The binary counter 221 counts pulses in the oscillation signal (FIG. 12A) from the oscillator 21 and outputs cyclic numbers 0-7 as shown in FIG. 12B. The decoder 222 decodes number 7 of the output signal from the binary counter 221. Then, the oscillation signal is divided by 8. The frequency-divider 26 has the same structure as the frequency-divider 22.

The frequency-divider 22 is not necessary if an oscillator having an oscillation frequency equal to the freuqency of the output signal of frequency-divider 26 is used instead of the oscillator 21.

The frequency-divider 22 and the delay circuit 23 may be replaced by a circuit shown in FIG. 13, and FIGS. 14A-14D show time charts of points A-D in FIG. 13. The binary counter 223 counts pulses in the oscillation signal (FIG. 14A) from the oscillator 21 and outputs cyclic numbers 0-7 as shown in FIG. 14B. The decoders 224 and 225 respectively decode numbers 5 and 7 of the output signal from the binary counter 223. Then, the decoder 224 outputs an advanced divided signal and the decoder 225 outputs a delayed divided signal.

Figure 15:
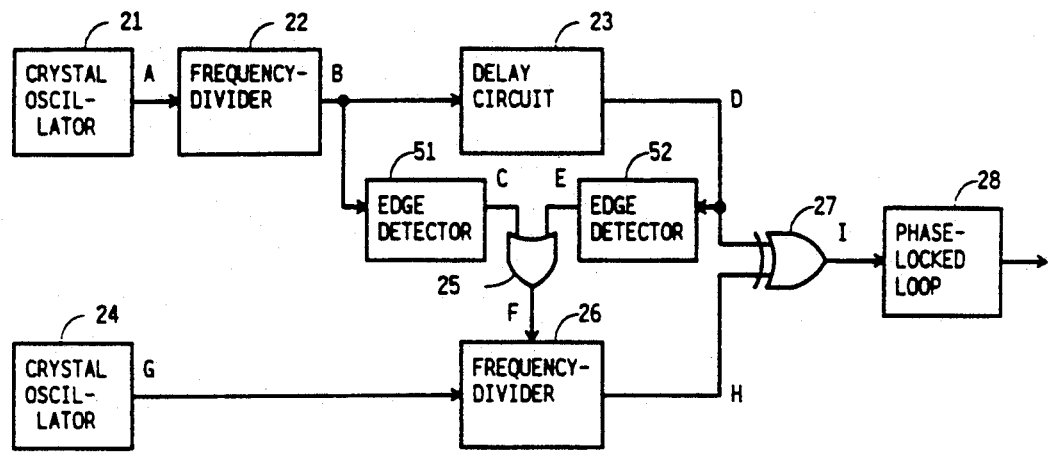
FIG. 15 is a block diagram of a second embodiment of a signal generator in accordance with the present invention.
Figure 16A:
FIGS. 16A-16I are time charts for the operation of the signal generator of FIG. 15.
Figure 16B:
Figure 16C:
Figure 16D:
Figure 16E:
Figure 16F:
Figure 16G:
Figure 16H:
Figure 16I:

In the first embodiment, frequency-divider 26 is reset at the rising point of the reset signal. However, many frequency-dividers on the market are reset while the reset signal is at a high (or low) level. If such a frequency-divider is used as frequency-divider 26, the frequency-divider outputs a continuing low level signal as in the case of FIGS. 6A-6G. FIG. 15 shows a second embodiment, in which a frequency-divider which is reset while the reset signal is at a high level, can be used. FIGS. 16A-16I show time charts of points A-I in FIG. 15. The difference between FIG. 3 and FIG. 15 is that edge detectors 51 and 52 are inserted in front of each input of OR gate 25. Therefore, the reset signal (FIG. 16F) from OR gate 25 returns to a low level even if the output signal (FIG. 16B) of frequency-divider 22 continues at a high level.

Figure 17:
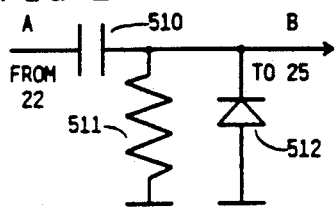
FIG. 17 is a circuit diagram of the edge detector 51 of FIG. 15.
Figure 18A:
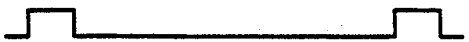
FIGS. 18A and 18B are time charts for the operation of the edge detector of FIG. 17.
Figure 18B:

FIG. 17 shows one type of edge detector, and time charts of points A and B are shown in FIGS. 18A and 18B. The edge detector has a serial capacitor 510, a parallel resistor 511 and a diode 512. The serial capacitor 510 and the parallel resistor 511 make differential pulses of an input signal. The diode 512 deletes negative pulses.

Figure 19:
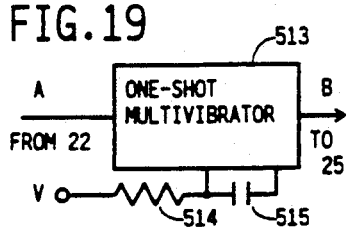
FIG. 19 is a block diagram of an alternate embodiment of an edge detector.
Figure 20A:
FIGS. 20A and 20B are time charts for the operation of the edge detector of FIG. 19.
Figure 20B:

Another type of edge detector is shown in FIG. 19, and FIGS. 20A and 20B show time charts of points A and B in FIG. 19. The edge detector is a one-shot multivibrator 513 having an external resistor 514 and an external capacitor 515. A pulse width Tw of an output signal is determined by R-C constants of the resistor 514 and the capacitor 515.

Figure 21:
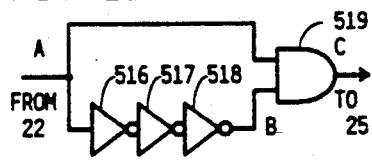
FIG. 21 is a block diagram of still another embodiment of an edge detector.
Figure 22A:
FIGS. 22A-22C are time charts for the operation of the edge detector of FIG. 21.
Figure 22B:
Figure 22C:

FIG. 21 shows another type of edge detector and time charts of points A-C are shown in FIGS. 22A-22C. The edge detector of FIG. 21 has three serial inverters 516, 517 and 518 and an AND gate 519. The three serial inverters 516, 517 and 518 output delayed and inverted signals. The total delay time is triple the delay time of each inverter. The AND gate 519 outputs a pulse having a pulse width Tw equal to the total delay time.

In this case, the delay time Td of the delay circuit 23 is given by the following formula:

$$Td > N/f1 \text{ min} - (N-1)/f2 \text{ max} - Tw.$$

If the pulse width Tw of the output signal of the edge detectors 51 and 52 is shorter than the delay time Td of the delay circuit 23, the reset signal from the OR gate 25 has two pulses per one pulse of the divided signal output from the frequency-divider 22. In this case, a frequency-divider which is reset at a rising point of the reset signal can be used as the frequency-divider 26.

Figure 23:
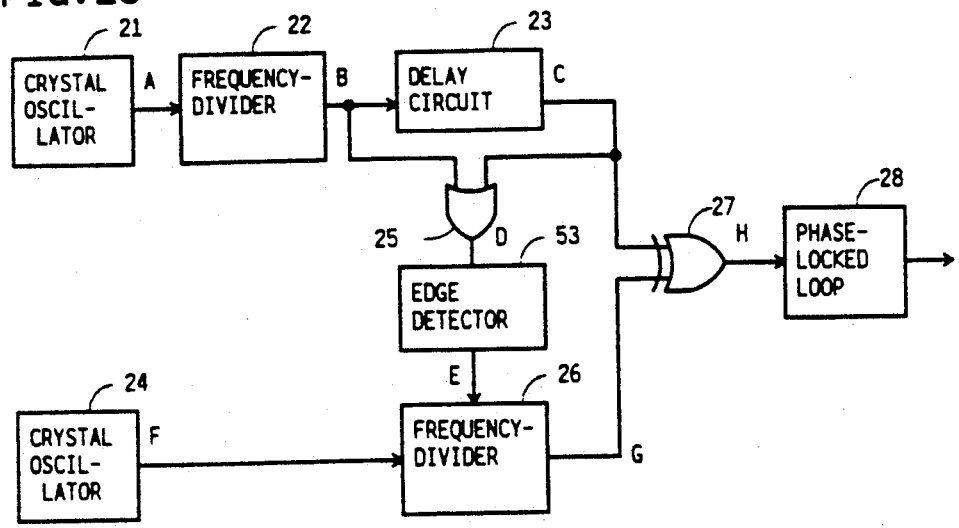
FIG. 23 is a block diagram of a third embodiment of a signal generator in accordance with the present invention.
Figure 24A:
FIGS. 24A-24H are time charts for the operation of the signal generator of FIG. 23.
Figure 24B:
Figure 24C:
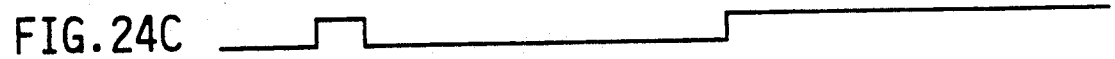
Figure 24D:
Figure 24E:
Figure 24F:
Figure 24G:
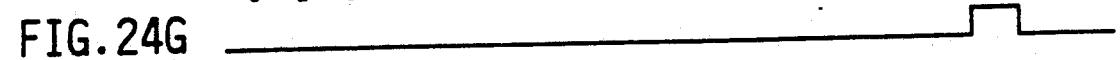
Figure 24H:
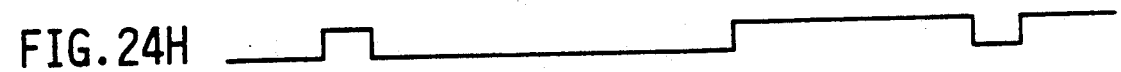

FIG. 23 shows a third embodiment of the invention and time charts of points A-H are shown in FIGS. 24A-24H. The difference between FIG. 15 and FIG. 23 is that edge detector 53 is inserted at the output of the OR gate 25 instead of the inputs. Also in this embodiment, the reset signal returns to a low level even if the output signal (FIG. 24B) of frequency-divider 22 continues at a high level.

Figure 25:
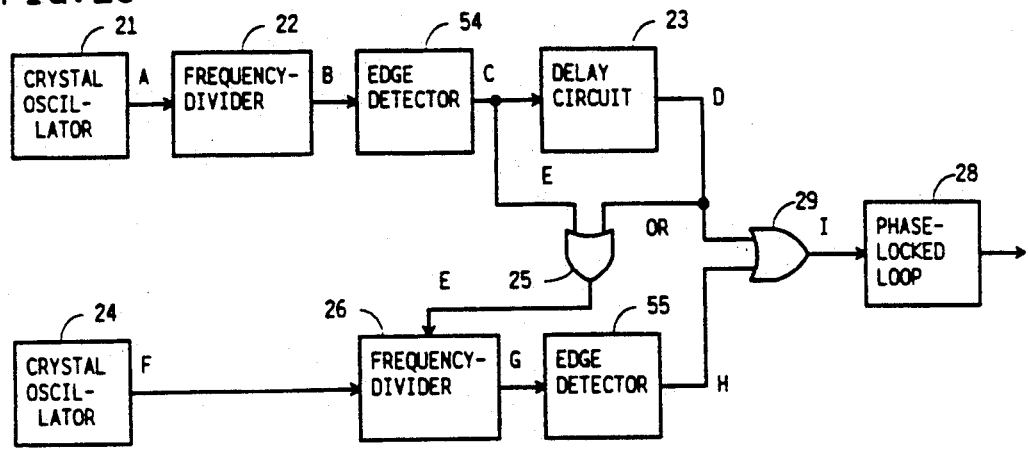
FIG. 25 is a block diagram of a fourth embodiment of a signal generator in accordance with the present invention.
Figure 26A:
FIGS. 26A-26I are time charts for the operation of the signal generator of FIG. 25.
Figure 26B:
Figure 26C:
Figure 26D:
Figure 26E:
Figure 26F:
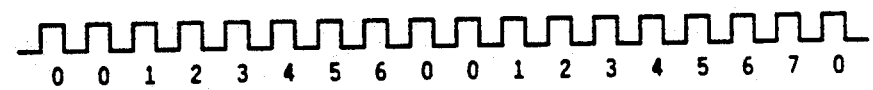
Figure 26G:
Figure 26H:
Figure 26I:
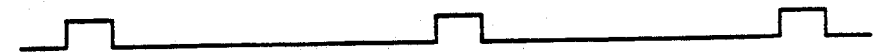

A fourth embodiment of the invention is shown in FIG. 25 and time charts of points A-I are shown in FIGS. 26A-26I. In this embodiment, edge detectors 54 and 55 are inserted at outputs of the frequency dividers 22 and 26. Therefore, the divided signals (FIGS. 26C, 26D and 26H) return to a low level and the reset signal (FIG. 26E) also returns to a low level even if the output signal (FIG. 26B) of frequency-divider 22 continues at a high level. Because the divided signals (FIGS. 26C, 26D and 26H) return to a low level, OR gate 29 can be used instead of the exclusive-OR gate 28.

When the pulse width Tw meets the following condition:

$$Tw > N/f1 \text{ min} - (N-1)/f2 \text{ max},$$

the delay circuit 23 and the OR gate 25 are not necessary in the embodiments of FIGS. 15, 23 and 25. Then, in the embodiments of FIGS. 15 and 23, the output signal of the frequency-divider 22 is input to the frequency-divider 26 through the edge detector (51 or 53) and is directly input to the exclusive-OR gate 27. In the embodiment of FIG. 25, the output signal of the edge detector 54 is directly input to the frequency-divider 26 and the OR gate 29.

In the embodiments above, the duty ratio of the output signal from the frequency-divider 26 is 1/N. However, if the duty ratio R is another value, for example ½, "(N−1)" in the above three formulas should be changed to "N(1−R)".

The foregoing is considered as illustrative only of the preferred embodiments and principles of the present invention. Further, since numerous modifications and changes will readily occur to those skilled in the art, it is not desired to limit the invention to the exact construction and applications shown and described, and accordingly, all suitable modifications and equivalents may be resorted to, as falling within the scope of the invention in the appended claims and their equivalents.

What is claimed is:

1. A signal generator having a switching function comprising:
    first oscillation means for outputting a first frequency signal having a first frequency and a reset signal synchronized with the first frequency signal;
    second oscillation means for outputting a second frequency signal having a second frequency which is N times higher than the first frequency, where N is a real number;
    frequency-division means, coupled to said first and second oscillation means, for frequency-dividing the second frequency signal by N, for resetting a value for frequency-division based on the reset signal and for generating a divided second frequency signal; and
    combination means, coupled to said first oscillation means and said frequency division means, for combining the first frequency signal and the divided second frequency signal and for outputting a combined signal.

2. A signal generator according to claim 1, wherein said first oscillation means includes:
    first frequency signal generation means for generating an advanced first frequency signal and a delayed first frequency signal, and for outputting the delayed first frequency signal to said combination means as the first frequency signal, and
    reset signal generation means for generating the reset signal based on the advanced first frequency signal and the delayed first frequency signal.

3. A signal generator according to claim 2, wherein said first frequency signal generation means includes:
    an oscillator to output an oscillation signal;
    a frequency-divider coupled to the oscillator, to frequency-divide the oscillation signal and to output the advanced first frequency signal; and
    a delay circuit coupled to the frequency-divider, to delay the advanced first frequency signal and to output the delayed first frequency signal.

4. A signal generator according to said claim 3, wherein said delay circuit is a plurality of inverter gates connected in series.

5. A signal generator according to said claim 3, wherein said delay circuit is a plurality of flip-flops connected in series.

6. A signal generator according to said claim 3, wherein said delay circuit includes a plurality of unit delay circuits connected in series and wherein each unit delay circuit includes a serial resistor, a parallel capacitor connected to the serial resistor and a Schmitt trigger gate connected to the serial resistor and the parallel capacitor.

7. A signal generator according to claim 3, said frequency-divider includes:
    a counter coupled to the oscillator to count pulses in the oscillation signal; and
    a decoder coupled to the counter, to decode a value in the counter and to output the advanced first frequency signal.

8. A signal generator according to claim 2, wherein said first frequency signal generation means includes:
    an oscillator to output an oscillation signal;
    a counter coupled to the oscillator, to count pulses in the oscillation signal to produce first and second values;
    a first decoder coupled to the counter, to decode the first value in the counter and to output the advanced first frequency signal; and
    a second decoder coupled to the counter, to decode the second value in the counter and to output the delayed first frequency signal.

9. A signal generator according to claim 2, wherein said reset signal generation means includes an OR gate coupled to said first frequency signal generation means, which OR's the advanced first frequency signal and the delayed first frequency signal, to generate the reset signal.

10. A signal generator according to claim 2, wherein said reset signal generation means includes
    first edge detecting means for generating a first pulse signal based on a front edge of the advanced frequency signal;
    second edge detecting means for generating a second pulse signal based on a front edge of the delayed frequency signal; and
    an OR gate coupled to said first and second edge detecting means, which OR's the first pulse signal and the second pulse signal, to generate the reset signal.

11. A signal generator according to claim 2, wherein said reset signal generation means includes an OR gate coupled to said first frequency signal generation means, which OR's the advanced first frequency signal and the delayed first frequency signal to generate an OR signal; and
    edge detecting means for generating the reset signal based on a front edge of the OR signal.

12. A signal generator according to claim 2, wherein said frequency-division means includes:
    a counter coupled to said second oscillation means, to count pulses in the second frequency signal; and
    a decoder coupled to the counter, to decode a value in the counter and to output the divided second frequency signal.

13. A signal generator according to claim 2, wherein said combination means is an exclusive OR-gate.

14. A signal generator according to claim 2, wherein said first frequency signal generation means includes:
- an oscillator to output an oscillation signal;
- a first frequency-divider coupled to the oscillator, to frequency-divide the oscillation signal and to output a first frequency-divided signal;
- first edge detecting means for generating the advanced first frequency signal based on a front edge of each pulse of the first frequency-divided signal; and
- a delay circuit coupled to said first edge detecting means, to delay the advanced first frequency signal and to output the delayed first frequency signal;

and wherein said frequency division means includes:
- a second frequency-divider coupled to said second oscillation means, to frequency-divide the second frequency signal and to output a second frequency-divided signal; and
- second edge detecting means for generating the divided second frequency signal based on a front edge of each pulse of the second frequency-divided signal.

15. A signal generator according to claim 14, wherein said combination means is an OR gate.

16. A signal generator according to claim 1, further comprising:
- filter means, coupled to said combination means, for absorbing a fluctuation of a frequency of the combined signal.

17. A signal generator according to claim 16, wherein said filter means is a phase-locked loop including:
- a phase comparator coupled to said combination means, to make a comparison between phases of the combined signal and an output signal of the phase-locked loop and to output a result signal of the comparison;
- a filter coupled to the phase comparator, to decrease a high frequency component of the result signal and to output a filtered signal; and
- a voltage-controlled oscillator coupled to the filter, to generate the output signal of the phase-locked loop having a frequency controlled by the filtered signal.

18. A signal generator having a switching function comprising:
- first oscillation means for outputting a first frequency signal having a first frequency and a reset signal synchronized with the first frequency signal;
- a second oscillator to output a second frequency signal having a second frequency which is N times higher than the first frequency, where N is a real number;
- a frequency-divider, coupled to said first oscillation means and said second oscillator, to frequency-divide the second frequency signal by N, to reset a value for frequency-division based on the reset signal and to generate a divided second frequency signal; and
- a combining circuit, coupled to said first oscillation means and said frequency-divider, to combine the first frequency signal and the divided second frequency signal and to output a combined signal.

19. A method for generating a signal, comprising the steps of:
- (a) generating a first frequency signal and a reset signal synchronized with the first frequency signal;
- (b) generating a second frequency signal having a second frequency which is N times higher than the first frequency, where N is a real number;
- (c) frequency-dividing the second frequency signal by N and resetting a value for frequency-division based on the reset signal, to generate a divided second frequency signal; and
- (d) combining the first frequency signal and the divided second frequency signal to output a combined signal.

* * * * *